(12) United States Patent
Babudri et al.

(10) Patent No.: US 6,693,829 B2
(45) Date of Patent: Feb. 17, 2004

(54) TESTING METHOD FOR A READING OPERATION IN A NON VOLATILE MEMORY

(75) Inventors: Irene Babudri, Burago Molgora (IT); Mauro Giacomini, Bergamo (IT)

(73) Assignee: STMicroelectronics S.R.l., Agrate Brianza (IT)

( * ) Notice: Subject to any disclaimer, the term of this patent is extended or adjusted under 35 U.S.C. 154(b) by 29 days.

(21) Appl. No.: 10/068,565

(22) Filed: Feb. 5, 2002

(65) Prior Publication Data

US 2002/0141241 A1 Oct. 3, 2002

(30) Foreign Application Priority Data

Feb. 5, 2001 (EP) .............................. 01830068

(51) Int. Cl.[7] ........................ G11C 16/28; G11C 16/34
(52) U.S. Cl. ............... 365/185.22; 365/185.2; 365/185.24
(58) Field of Search ............ 365/185.22, 185.2, 365/185.24, 185.21, 185.03

(56) References Cited

U.S. PATENT DOCUMENTS

| | | | |
|---|---|---|---|
| 5,185,722 A | 2/1993 | Ota et al. | |
| 5,386,388 A | * 1/1995 | Atwood et al. | 365/185.22 |
| 5,539,690 A | * 7/1996 | Talreja et al. | 365/185.22 |
| 6,219,282 B1 | 4/2001 | Tanaka | |

FOREIGN PATENT DOCUMENTS

JP      2001 022650 A      1/2001

* cited by examiner

Primary Examiner—Michael S. Lebentritt
Assistant Examiner—Jung H. Hur
(74) Attorney, Agent, or Firm—Lisa K. Jorgenson; Bryan A. Santarelli; Graybeal Jackson Haley LLP

(57) ABSTRACT

A memory device implements a reading operation. The memory device includes first, second, and third memory cells; a read circuit coupled to the memory cells and operable to read first, second, and third values, respectively, from the first, second, and third memory cells; and a comparison circuit coupled to the read circuit and operable to compare the first and second values with fourth and fifth predetermined values and to generate a data-valid signal that indicates that the third value is valid if the first and second values equal the fourth and fifth values, respectively. The memory device may further include a selection circuit coupled to the read circuit and to the comparison circuit and operable to couple the third value to a data bus in response to the data-valid signal.

42 Claims, 2 Drawing Sheets

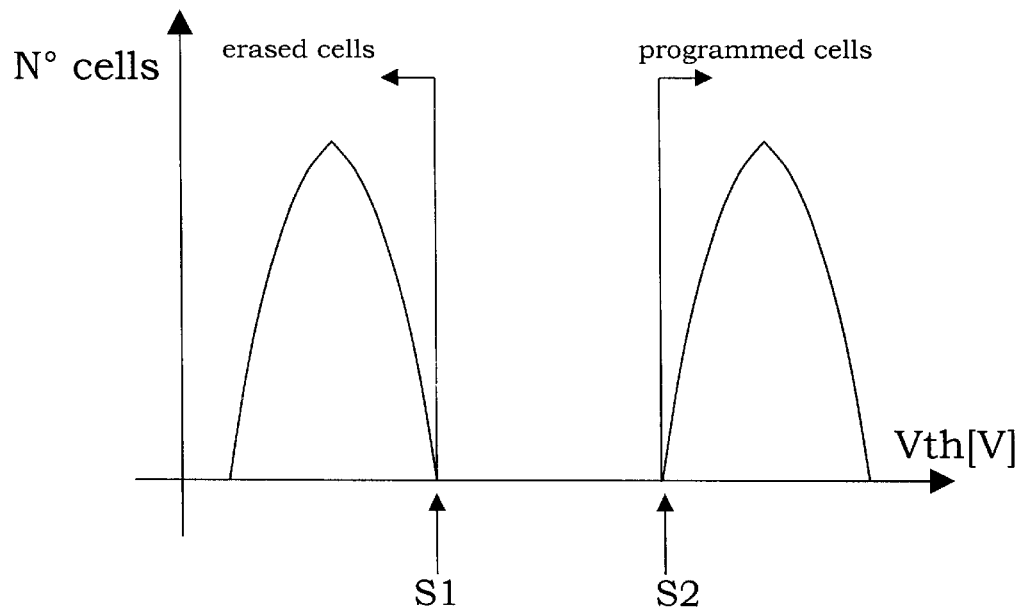
FIG. 1
PRIOR ART
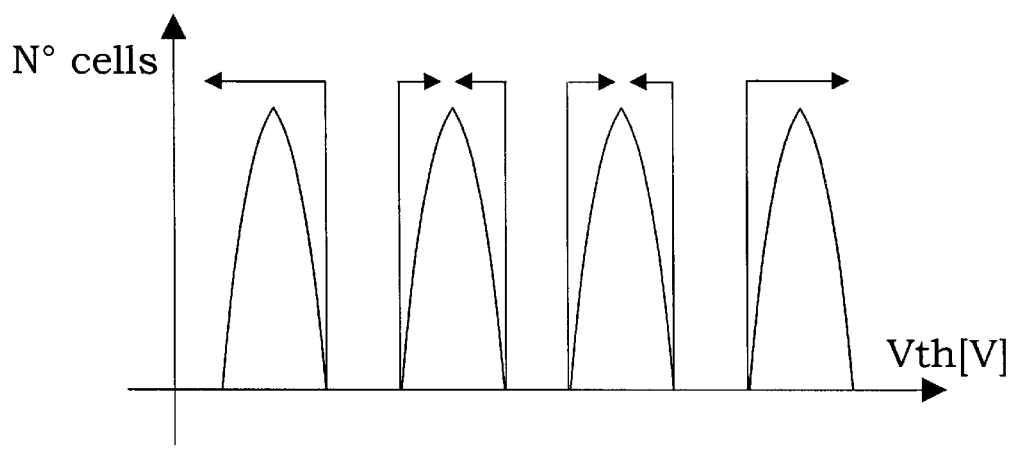
FIG.. 2
PRIOR ART

TESTING METHOD FOR A READING OPERATION IN A NON VOLATILE MEMORY

FIELD OF THE APPLICATION

This invention relates to a testing method for a reading operation in a memory device.

PRIOR ART

As is well known, it is common for so-called "on-chip" systems to have two different supply-voltage references.

In particular, systems intended for automotive use usually have a first or external supply-voltage reference of about 5V±10%, hereinafter designated VDDEXT, and a second or internal supply-voltage reference, hereinafter designated VREG, which is a regulated voltage.

In general, the second regulated voltage reference VREG is derived from the first voltage reference VDDEXT as the low-voltage output of a voltage regulator, which is usually integrated into the system.

Non-volatile memories, in particular flash memories, which are also integrated into the system, use the internal regulated voltage reference VREG for their supply reference, whose value usually approximates 2V in the instance of 0.18 μm technologies.

Such flash memories sometime also use the external voltage reference VDDEXT in the voltage booster circuits with which they are usually equipped.

In automotive applications, reliable system performance is of primary concern, especially at power-up or power drop of either of the external and internal supply voltage references, VDDEXT and VREG.

In fact, outside the power-supply range specified for the memory (1.8V±10% for a flash memory), the correctness of any data read in the memory cannot be ensured, and thus the proper operating of the system is a consequence of such reading.

Accordingly, this is a matter of preventing the Flash memory from being read outside said safe range.

Particularly with automotive applications, the specifications for normal operation of the system (such as a minimum power-supply reference level, or a pre-set duration of the read-voltage ramp, etc.) cannot be ensured in case of a breakdown of the vehicle comprising such a system. There is a risk that the application could fail, thus obtaining no predetermined results, because the data could be read incorrect.

The importance of reliability in data reading is highlighted by the control of crash airbags on a vehicle: here the risk would be that an incorrect data reading would activate them at an improper time.

To avoid incorrect data reading, and malfunctioning of the whole system, it has been common practice to arrange for an external device to enable reading in a flash memory only if conditions are right. In particular, such an external device comprises essentially low-voltage detectors, which are connected to the-external and internal supply-voltage references of the flash memory.

In practice, it is difficult to design reliable detectors having a threshold value which lies very close to the minimum value in the supply-voltage range specified for a flash memory (normally 1.6V±50 mV), and being stable through the temperature range (–40° C. to 125° C.) that prevails in an automotive environment.

Thus, it is difficult to provide circuit devices operative to enable reading in a flash memory only when the information is sure to be read correctly, that is when the voltage references are within a pre-set range.

Consequently, there is a need for a technique for testing a reading operation in a non-volatile memory for correctness and that overcomes the limitations of the prior art.

SUMMARY OF THE INVENTION

One embodiment of the present invention includes a method for:

providing first and second memory cells having predetermined threshold values;

pre-programming a logic value in the first and second cells;

performing a reading operation in the first and second cells;

comparing the values read with the expected logic contents of the cells;

based upon the outcome of the above comparison, deciding whether to continue reading from the memory device that contains the first and second cells.

Another embodiment of the invention includes a memory device that implements this testing method.

Further features and advantages of the invention will be apparent from the following detailed description thereof, to be read in conjunction with the accompanying drawings, in which:

BRIEF DESCRIPTION OF THE DRAWINGS

FIG. 1 is a plot of the known distribution of the threshold values of two-level memory cells in a memory device;

FIG. 2 is a plot of the known distribution of the threshold values of multi-level memory cells in a memory device;

DETAILED DESCRIPTION

Figure 3:
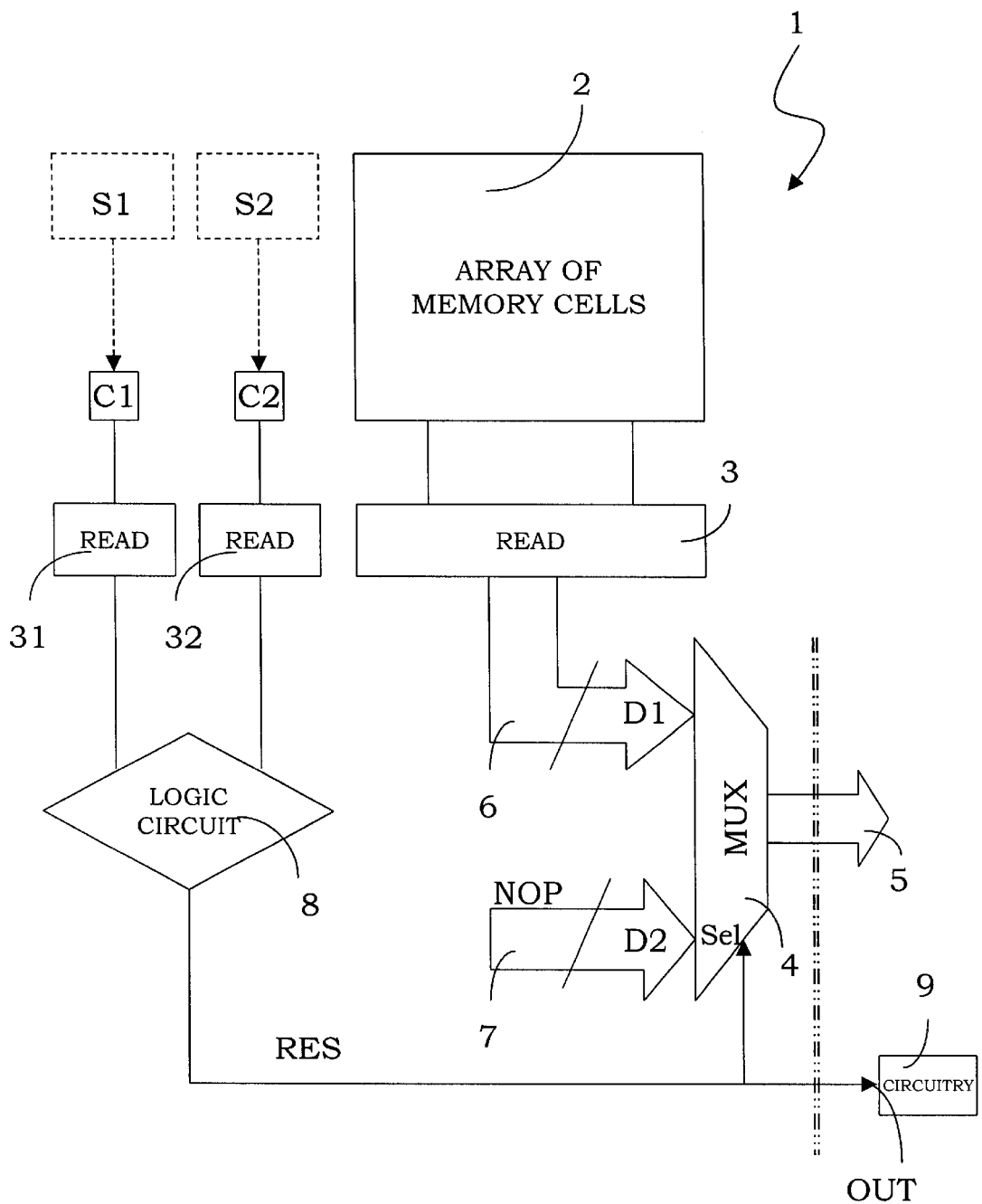
FIG. 3 is a schematic block diagram of a memory architecture that can implement the testing of a reading operation according to an embodiment of the invention.

The well-known instance of a two-level memory device, specifically a two-level flash memory, will be considered first.

FIG. 1 is a plot of the pattern of distribution of threshold voltages for cells of the two-level memory device.

Threshold-voltage limiting values can be located, namely a maximum value S1 and a minimum value S2, for the threshold-voltage distribution found for the two-level memory device, by performing a characterization of the memory cells throughout the operating temperature range of the memory device. In particular, this characterization allows at least first and second "end" cells to be identified which correspond to the "tails" of the programmed and erased cells, that is to the worst-case erased cell and the worst-case programmed cell of the memory device, the aforesaid threshold voltage extreme values S1 and S2 corresponding to those cells.

When a reading operation of these two end cells having the extreme threshold-voltage values S1 and S2 is performed correctly, the reading operation of all the other cells which have threshold voltages below and above, respectively, the extreme values S1 and S2 will also be correct.

Advantageously according to an embodiment of the invention, first and second additional cells, C1 and C2 (FIG. 3), are provided in the memory device and have threshold values corresponding to the maximum S1 and minimum S2 values, but for any appropriate margins, such that the first cell C1 is read as an erased cell, i.e., a logic "1", and the second cell C2 is read as a programmed cell, i.e., a logic "0".

Therefore, since the contents of the first and second cells C1 and C2 are known beforehand, it becomes possible to determine whether a reading operation performed on the additional cells C1, C2 is correct.

Based on the result of the above test for correctness, a decision is made as to whether reading in the memory device should be continued or discontinued, i.e., as to which data should be output, thereby ensuring that reliable data will be read under any conditions of operation.

Briefly, this embodiment of the invention provides a method for internally testing a reading operation in a memory device, which method comprises the steps of:

providing first C1 and second C2 additional memory cells whose threshold voltage values correspond to a maximum value S1 and a minimum value S2 of a distribution of threshold voltages of the cells in the memory device;

programming the first C1 and second C2 additional memory cells with predetermined first and second logic values, specifically a logic "1" and logic "0", respectively;

simultaneously reading the logic contents of the first C1 and second C2 additional memory cells, and of the bits which correspond to an addressed word and, therefore, to a data D1 to be read;

comparing the logic contents read in the first C1 and second C2 additional memory cells with the first and second predetermined logic values;

generating a result signal RES representing the result of the previous comparison step.

In particular, the result signal RES will have a first value POS in the event of the logic contents read in the first C1 and second C2 additional cells matching the first and second predetermined logic values previously stored therein, and have a second value NEG when said logic contents fail to match the first and second predetermined logic values.

Based upon the result signal RES, the internal testing method of this embodiment of the invention further comprises the following steps:

when the result signal RES has the first value POS, i.e., when the logic contents of cells C1 and C2 match the values previously stored therein and the reading operation of the cells C1 and C2 is correct, ending the reading operation of the address word, and delivering the data D1 read to a data buffer of the memory device;

when the result signal RES has the second value NEG, i.e., when the logic contents of cells C1 and C2 do not match the values previously stored therein and the reading operation of the cells C1 and C2 is, therefore, incorrect, substituting alternative data D2 to the data D1 read at the addressed word in the memory device, since data D1 cannot be guaranteed to be correct.

Data D1, having been read in a potentially incorrect manner, may in principle correspond to the code of an instruction to jump to an application code segment not known beforehand, which may have unpredictable consequences.

All this is unacceptable for automotive applications.

Advantageously in this invention, a NOP (NO Operation) instruction is supplied as the alternative data D2 to prevent incorrect reading. In the extreme, the NOP instruction will stop the application. In particular, the NOP instruction corresponds to an operative code of a specific assembler in the memory device.

The NOP instruction prevents incorrect data D1 from being issued over the data bus of the memory device, and thus prevents potentially dangerous malfunctioning of the system, which includes it. Also, the NOP instruction initiates no further instructions to the system, thus ensuring reliable performance of the latter, as automotive applications indeed demand.

FIG. 3 is a schematic block diagram of a two-level flash memory device adapted to implement the above-described method according to an embodiment of the invention.

The memory device 1 comprises an array 2 of memory cells connected to a data buffer 5 via a dedicated reading block 3 and a multiplexer 4.

Multiplexer 4 receives a data D1, read in the cell array 2, from the dedicated reading block 3, through a bus 6, and receives alternative data D2 through another bus 7.

Advantageously, according to an embodiment of the invention, the memory device 1 further comprises first C1 and second C2 additional cells whose threshold voltage values correspond to a maximum value S1 (relating to the worst-case erased cell) and a minimum value S2 (relating to the worst-case programmed cell) of the two threshold voltage distributions of the cell array 2.

These threshold distributions, shown schematically in FIG. 1, are obtained by characterizing the array 2 within the range of operating temperatures of the memory device 1.

It should be noted that the first C1 and second C2 additional cells advantageously are internal cells of the cell array 2, although unavailable for storing user's data. They are shown separate in FIG. 3 to emphasise their different operation.

By being part of the array 2, the additional cells C1 and C2 will have characteristics that closely match the other memory cells in the cell array 2.

Advantageously, according to an embodiment of the invention, both additional cells C1 and C2 are set to threshold values that correspond to the maximum S1 and minimum S2 values of the distributions, these threshold values respectively corresponding to a cell which is normally read as a logic "1" and to another one which is normally read as a logic "0".

As said before, the threshold values of C1 and C2 are selected on the basis of the distribution intervals of the threshold voltages of the programmed cells and the erased cells, with appropriate margin.

The additional cells C1 and C2 are connected to a logic circuit 8 through first 31 and second 32 secondary reading blocks, the circuit 8 being in turn connected to the multiplexer 4 and to an output terminal OUT of the memory device 1. The reading blocks 31 and 32 may be part of the reading block 3, although they are shown separately to emphasize their operation.

The operation of the memory device 1 according to an embodiment of the invention will now be described as relates to a testing method according to an embodiment of the invention.

At each reading cycle of the cell array 2, an addressed word, and the additional cells C1, C2, are read simultaneously, the latter being selected, each time that the memory 1 is accessed, through the secondary reading blocks 31 and 32.

The logic circuit 8 compares the values read in the additional cells C1 and C2 with expected values, known a priori, and issues a result signal RES.

As said before, when the values read in the additional cells C1 and C2 match the expected values, i.e., the reading operation is correct, the result signal RES will have a first value POS and allows the read data D1 output to transfer from the dedicated reading block 3 to the data bus 5.

If a reading error has occurred, the result signal RES will have a second value NEG, which enables transfer of the alternative data D2, which is on the bus 7 (NOP), to the data bus 5.

Note that in one embodiment, the result signal RES is a selection signal (Sel) for the multiplexer 4, which will blanket the read data D1. In addition, the result signal RES is used as an output signal OUT to activate any logic circuitry 9 and place the memory device in a continuous reading loop at the same location until the external condition, such as noise in the supply voltage reference, that is causing the reading error, is removed and the data is read correctly, whereupon the output signal OUT is deactivated.

Advantageously according to this embodiment of the invention, the testing method does not lengthen the reading time of the memory device 1, since it uses an internal testing or auto-test step concurrently with the reading operation.

In a modified embodiment, first and second bit-lines of cells are employed for storing a logic "0" and a logic "1", in place of the additional cells C1 and C2.

Also, two bit lines could be introduced every n column of logic addresses, and the cells of these bit lines be pre-programmed, so that two more bits can always be read to verify that the cell array 2 is read correctly.

In this way, the added cells in these bit lines would even better represent the whole population of cells constituting the cell array 2.

The above-described reading-testing method may be extended to encompass a multi-level memory device according to an embodiment of the invention.

In this case, there would be N levels and N−1 thresholds, as shown in FIG. 2, and it would be necessary to test the bits in the N distributions for correct reading, with due margin. Since each threshold value has upper and lower limits, (N−1)*2 bits would have to be read at each access, to have the reading operation of the multi-level memory device tested for correctness.

In such a case, 2*(N−1) additional cells would be provided, and distributed modularly inside the cell array 2.

In this way, the reliability of all reading operations can be ensured even in the presence of noise on the supply voltage reference. The added consumption brought about by more bits having to be read is justified by the need to ensure reliable performance in automotive and other applications.

It is noteworthy that the testing methods according to the embodiments of the invention are not to be equated to a parity bit or a bit for correcting read data. In this case, the embodiments of the invention inherently ensure that no data D1 read potentially incorrectly is transferred from the memory device 1 to the data bus 5.

In actual practice, these methods may also be applied to ensure that the parity bit is read correctly, since the latter is a bit of a word of the memory device.

Furthermore, these methods, rather than adding cells for reading simultaneously with the addressed word, allows reference cells already present in the reference array (not shown), which is normally part of the memory device, to be used, such reference cells being used by the device reading circuit during margined testing operations, for example.

Finally, these methods are effective to prevent random data from being output from the memory device to the data bus, even outside the device specifications, for example, for the supply voltage reference. In this way, the memory device is provided a broader range of correct operation than are prior-art devices.

What is claimed is:

1. A memory device, comprising:

first, second, and third memory cells;

a read circuit coupled to the memory cells and operable to read first, second, and third values, respectively, from the first, second, and third memory cells; and a comparison circuit coupled to the read circuit and operable to compare the first and second values with fourth and fifth predetermined values and to generate a data-valid signal that indicates that the third value is valid if the first and second values equal the fourth and fifth values, respectively.

2. The memory device of claim 1, further comprising a selection circuit coupled to the read circuit and to the comparison circuit and operable to couple the third value to a data bus in response to the data-valid signal.

3. The memory device of claim 1, further comprising a memory-cell array that is coupled to the read circuit and that includes the first, second, and third memory cells.

4. The memory device of claim 1 wherein the first, second, and third memory cells each comprise a respective nonvolatile memory cell.

5. The memory device of claim 1, further comprising:

a memory-cell array that is coupled to the read circuit and that includes a plurality of nonvolatile memory cells including the third memory cell, the plurality of cells having a range of erased thresholds that includes a maximum erased threshold and having a range of programmed thresholds that includes a minimum programmed threshold;

wherein the first memory cell has a threshold that is greater than or equal to the maximum erased threshold; and wherein the second memory cell has a threshold that is less than or equal to the minimum programmed threshold.

6. The memory device of claim 1 wherein the comparison circuit is further operable to generate a data-invalid signal that indicates that the third value is invalid if the first value does not equal the fourth value or if the second value does not equal the fifth value.

7. A memory device, comprising:

first, second, and third memory cells;

a read circuit coupled to the memory cells and operable to read first, second, and third values, respectively, from the first, second, and third memory cells; and a comparison circuit coupled to the read circuit and operable to compare the first and second values with fourth and fifth predetermined values and to generate a data-invalid signal that indicates that the third value is invalid if the first value does not equal the fourth value or if the second value does not equal the fifth value.

8. The memory device of claim 7, further comprising a selection circuit coupled to the read circuit and to the comparison circuit and operable to uncouple the third value from a data bus in response to the data-invalid signal.

9. The memory device of claim 7, further comprising a selection circuit coupled to the read circuit and to the comparison circuit and operable to couple a predetermined value to a data bus in response to the data-invalid signal.

10. The memory device of claim 7, further comprising a selection circuit coupled to the read circuit and to the comparison circuit and operable to uncouple the third value from a data bus and to couple a no-operation value to the data bus in response to the data-invalid signal.

11. The memory device of claim 7, further comprising logic circuitry coupled to the comparison circuit and operable to implement a read loop in response to the data-invalid signal.

12. The memory device of claim 7 wherein the first, second, and third memory cells each comprise a respective nonvolatile memory cell.

13. The memory device of claim 7, further comprising:
a memory-cell array that is coupled to the read circuit and that includes a plurality of nonvolatile memory cells including the first, second, end third memory cells, the plurality of cells having a range of erased thresholds that includes a maximum erased threshold and having a range of programmed thresholds that includes a minimum programmed threshold;
wherein the first memory cell has a threshold that is greater than or equal to the maximum erased threshold; and
wherein the second memory cell has a threshold that is less than or equal to the minimum programmed threshold.

14. A method, comprising:
reading first, second, and third values, from first, second, and third memory cells, respectively; and
indicating that the reading is valid if the first and second values equal fourth and fifth predetermined values, respectively.

15. The method of claim 14, further comprising allowing a device to access the third value if the reading is valid.

16. The method of claim 14, further comprising:
setting a threshold of the first memory cell to a threshold value that is greater than or equal to an erased-threshold value of the third memory cell; and
setting a threshold of the second memory cell to a threshold value that is less than or equal to a programmed-threshold value of the third memory cell.

17. The method of claim 14, further comprising:
setting a threshold of the first memory cell to a threshold value that is greater than or equal to a maximum erased-threshold value of a plurality of memory cells that includes the third memory cell; and
selling a threshold of the second memory cell to a threshold value that is less than or equal to a maximum programmed-threshold value of the plurality of memory cells.

18. The method of claim 14, further comprising indicating that the reading is invalid if the first value does not equal the fourth value or if the second value does not equal the fifth value.

19. A method, comprising:
reading first, second, and third values, from first, second, and third memory cells, respectively; and
indicating that the reading is invalid if the first value does not equal a fourth predetermined value or if the second value does not equal a fifth predetermined value.

20. The method of claim 19, further comprising preventing a device from accessing the third value if the reading is invalid.

21. The method of claim 19, further comprising coupling a predetermined value to a device if the reading is invalid.

22. The method of claim 19, further comprising coupling a no-operation value to a device if the reading is invalid.

23. The method of claim 19, further comprising implementing a read loop if the reading is invalid.

24. The method of claim 19, further comprising:
selling a threshold of the first memory cell to a threshold value that is greater than or equal to an erased-threshold value of the third memory cell; and
selling a threshold of the second memory cell to a threshold value that is less than or equal to a programmed-threshold value of the third memory cell.

25. The method of claim 19, further comprising:
selling a threshold of the first memory cell to a threshold value that is greater than or equal to a maximum erased-threshold value of a plurality of memory cells that includes the third memory cell; and
selling a threshold of the second memory cell to a threshold value that is less than or equal to a maximum programmed-threshold value of the plurality of memory cells.

26. A testing method of a reading operation in a memory device, which method comprises the steps of:
providing first and second additional memory cells whose threshold voltage values correspond to a maximum value and a minimum value of distributions of threshold voltages of a cell army of said memory device;
programming said first and second additional memory cells with predetermined first and second logic values;
simultaneously reading a logic contents of said first and second additional memory cells, and data to be read in said cell array;
comparing said logic contents of said first and second additional memory cells, as read during said reading step, with said first and second predetermined logic values respectively;
generating a result signal of said comparison step, said result signal having a first value in the event of said logic contents of said first and second additional memory cells, as read during said reading step, matching said first and second predetermined logic values, respectively, and having a second value in the event of said logic contents of said first and second additional memory cells, as read during said reading step, failing to match said first and second predetermined logic values, respectively.

27. The testing method according to claim 26, characterized in that it further comprises, based upon said result signal, the following steps:
when said result signal has said first value, ending said reading operation of said read data, and delivering the same to a data buffer of said memory device;
when said result signal has said second value, at the end of said reading operation, alternative data is delivered to a data buffer of said memory device instead of said read data.

28. The testing method according to claim 27, characterized in that, when said result signal has said second value, said read data is blanketed, and an instruction to stop operation is issued to said data buffer, said result signal also serving as an error signal supplied to an output terminal of said memory device.

29. The testing method according to claim 28, characterized in that said result signal activates a reading loop effective to lock said reading step to the same memory location until the result signal goes to said first value and said error signal is deactivated and said read data is output to said data bus of said memory device.

30. The testing method according to claim 26, characterized in that said maximum and minimum values of said threshold voltage distributions are found by characterizing said memory cells throughout the range of operating temperatures of said memory device.

31. The testing method according to claim 26, characterized in that said reading step is carried out simultaneously on an addressed word corresponding to said data to be read, and on said additional cells.

32. The testing method according to claim 26, characterized in that said memory device is of a multi-level type, and said reading testing operation is carded out on N distributions for (N-1)*2 bits at each access.

33. A memory device implementing comprising:
a memory cell array connected to a data bus through a dedicated reading block; and
a multiplexer, characterized in that it comprises first and second additional memory cells whose threshold voltage values correspond to a maximum value and a minimum value of distributions of threshold voltages of the cell array, being programmed with predetermined logic values and connected, through first and second secondary reading blocks for reading logic contents of said cells, to a logic circuit, in turn connected to said multiplexer and an output terminal of said memory device.

34. The memory device according to claim 33, characterized in that said logic circuit compares said logic contents of said additional cells with said predetermined logic values programmed therein, and generates a result signal having a first value in the event of said logic contents matching said first and second predetermined logic values, respectively, and having a second value in the event of said logic contents falling to match said first and second predetermined logic values.

35. The memory device according to claim 34, characterized in that said result signal functions as a selector of said multiplexer, such that when said result signal has said second value, said multiplexer outputs alternative data instead of said read data to said data bus.

36. The memory device according to claim 35, characterized in that said alternative data corresponds to an instruction to stop operation of said memory device.

37. The memory device according to claim 34, characterized in that said result signal activates, when at said second value, logic circuitry to lock said memory device reading step to the same memory location until said result signal goes to said first value.

38. The memory device according to claim 34, characterized in that said result signal, when at said first value, allows read data to be transferred to said data bus, while at the same time reading said cells through said dedicated reading block.

39. The memory device according to claim 33, characterized in that said additional cells are parts of said cell array.

40. The memory device according to claim 33, characterized in that said additional cells are parts of a reference array provided inside said memory device.

41. The memory device according to claim 33, characterized in that said additional cells correspond to first and second bit lines of cells.

42. The memory device according to claim 29, characterized in that said first and second bit lines of cells are arranged modularly in said memory array.

* * * * *

UNITED STATES PATENT AND TRADEMARK OFFICE
CERTIFICATE OF CORRECTION

PATENT NO. : 6,693,829 B2
DATED : February 17, 2004
INVENTOR(S) : Irene Babudri and Mauro Giocomini It is certified that error appears in the above-identified patent and that said Letters Patent is hereby corrected as shown below:

<u>Column 8,</u>
Line 5, please delete "selling" and insert -- setting --.
Line 22, please delete "army" and insert -- array --.

<u>Column 9,</u>
Line 10, please delete "carded", and insert -- carried --.
Line 12, after the word "device", please insert a comma -- , -- and delete "implementing".

<u>Column 10,</u>
Line 27, please delete "29" and insert -- 41 --.

Signed and Sealed this

Eighteenth Day of May, 2004

JON W. DUDAS
*Acting Director of the United States Patent and Trademark Office*